(12) United States Patent
Inada et al.

(10) Patent No.: US 9,525,417 B2
(45) Date of Patent: Dec. 20, 2016

(54) CAPACITIVE SENSOR DEVICE

(71) Applicant: TOKAI RUBBER INDUSTRIES, LTD., Aichi (JP)

(72) Inventors: Seishou Inada, Komaki (JP); Shijie Guo, Kasugai (JP); Takahisa Shiraoka, Kasugai (JP); Hiroshi Isobe, Kasugai (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 422 days.

(21) Appl. No.: 13/686,325

(22) Filed: Nov. 27, 2012

(65) Prior Publication Data

US 2013/0082763 A1 Apr. 4, 2013

Related U.S. Application Data

(63) Continuation of application No. PCT/JP2012/060551, filed on Apr. 19, 2012.

(30) Foreign Application Priority Data

Apr. 19, 2012 (JP) .................. 2011-092712

(51) Int. Cl.
*H01G 7/00* (2006.01)
*H03K 17/96* (2006.01)
(Continued)

(52) U.S. Cl.
CPC ............. *H03K 17/962* (2013.01); *G01L 1/146* (2013.01)

(58) Field of Classification Search
CPC ... G01L 9/0073; G01L 9/0072; G01N 27/223; H01H 2239/006; H03K 17/962; G01R 27/2605; G06F 3/044; G06F 3/0488
(Continued)

(56) References Cited

U.S. PATENT DOCUMENTS 4,644,801 A * 2/1987 Kustanovich ............ 73/862.046
4,827,763 A * 5/1989 Bourland et al. ............... 73/172
(Continued)

FOREIGN PATENT DOCUMENTS

CN 101188969 9/2010
JP 1-214727 8/1989
(Continued)

OTHER PUBLICATIONS

International Search Report dated Jul. 2, 2012, including English translation thereof.
(Continued)

*Primary Examiner* — Jenny L Wagner
*Assistant Examiner* — Arun Ramaswamy
(74) *Attorney, Agent, or Firm* — Greenblum & Bernstein, P.L.C.

(57) ABSTRACT

Provided is a capacitive sensor device capable of detecting the position and magnitude of external force with high accuracy.

Employed is a capacitive sensor which comprises pairs of electrodes arranged in a matrix, each of the pairs of electrodes being disposed to face each other with a distance therebetween, and an elastically deformable dielectric layer arranged between each of the pairs of electrodes. A capacitance measuring part measures capacitance of respective electrode pair groups in a plurality of combinations each comprising more than one of the pairs of electrodes including a selected one of the pairs of electrodes. An external force calculating part calculates the magnitude of external force applied to the position of the selected pair of electrodes based on a plurality of measured values of the capacitance.

4 Claims, 8 Drawing Sheets

(51) Int. Cl.
*H03K 17/945* (2006.01)
*G06F 3/045* (2006.01)
*G06F 3/042* (2006.01)
*G01L 1/14* (2006.01)

(58) Field of Classification Search
USPC ...... 361/283.1, 280, 291; 200/600; 345/173, 345/174; 327/517
See application file for complete search history.

(56) References Cited

U.S. PATENT DOCUMENTS

| | | | |
|---|---|---|---|
| 5,010,772 A * | 4/1991 | Bourland et al. | ........ 73/862.046 |
| 6,675,656 B1 | 1/2004 | Plochinger | |
| 2001/0029406 A1 | 10/2001 | Okamoto et al. | |
| 2008/0208063 A1 | 8/2008 | Brauers et al. | |

FOREIGN PATENT DOCUMENTS

| | | |
|---|---|---|
| JP | 6-52206 | 7/1994 |
| JP | 2001-287189 | 10/2001 |
| JP | 2003-014564 | 1/2003 |
| JP | 2006-329909 | 12/2006 |
| JP | 2006329909 A * | 12/2006 |
| JP | 2009-058445 | 3/2009 |
| JP | 2010-539690 | 12/2010 |
| WO | 2009/013965 | 1/2009 |
| WO | 2009/033728 | 3/2009 |

OTHER PUBLICATIONS

China Office action, dated Feb. 7, 2014 along with a partial English translation thereof.
Search report from E.P.O., mail date is Nov. 28, 2014.

* cited by examiner

CAPACITIVE SENSOR DEVICE

CROSS-REFERENCE TO RELATED APPLICATION

This is a continuation of Application PCT/JP2012/060551, filed on Apr. 19, 2012, which is incorporated herein by reference. The present invention is based on Japanese Patent Application No. 2011-092712, filed on Apr. 19, 2011, the entire contents of which are incorporated herein by reference.

BACKGROUND OF THE INVENTION

Field of the Invention

The present invention relates to a capacitive sensor device including a capacitive sensor having an elastically deformable dielectric layer disposed between each pair of opposing electrodes and, when external force is applied to the capacitive sensor, capable of measuring the position and magnitude of the external force by measuring capacitance which varies with deformation of the dielectric layer.

Description of the Related Art

A touch sensor using capacitance is described in International Publication NO. WO2009/013965. This touch sensor detects capacitance between an array of electrodes and the earth. For example, the touch sensor detects the position of an approaching human finger by making use of a fact that capacitance between some of the electrodes close to the finger and the earth varies with the approach of the finger.

Moreover, Japanese Examined Patent Publication No. H06-52206 describes not a device for measuring capacitance between electrodes and the earth, but a device including a capacitive sensor in which pairs of electrodes are arranged in a matrix and distance between some of the pairs of electrodes varies with elastic deformation of a dielectric layer caused by application of external force, and measuring distribution of applied external force by measuring capacitance of each of the pairs of electrodes.

SUMMARY OF THE INVENTION

In the device described in Japanese Examined Patent Publication No. H06-52206 in which distance between at least one of the pairs of electrodes varies with elastic deformation of the dielectric layer, the dielectric layer needs to have a sufficient thickness to be elastically deformed when the dielectric layer receives external force. If a sufficient thickness of the dielectric layer is secured, distance between the pair of electrodes increases. When the dielectric layer is elastically deformed by application of external force, capacitance between at least one of the pairs of electrodes varies with a decrease in distance between the pair of electrodes. However, if the distance between the pair of electrodes increases, the variation in capacitance decreases. Therefore, the resolution capability to detect the magnitude of external force decreases, so the device cannot detect the magnitude of external force with high accuracy.

In order to solve this problem, the variation in capacitance can be increased by expanding the area of each pair of electrodes when the same external force is applied. However, if the area of each pair of electrodes is expanded, the position of external force applied within the same pair of electrodes cannot be detected. That is to say, when viewed as a whole, such a sensor has a problem of being unable to detect the position of external force with high accuracy. As just described, conventionally it is not easy to detect the magnitude of external force with high accuracy while detecting the position of external force with high accuracy.

The present invention has been made in view of the abovementioned circumstances. It is an object of the present invention to provide a capacitive sensor device capable of detecting the position and magnitude of external force with high accuracy.

A capacitive sensor device according to the present means comprises a capacitive sensor comprising pairs of electrodes arranged in a matrix, each of the pairs of electrodes being disposed to face each other with a distance therebetween, and an elastically deformable dielectric layer arranged between each of the pairs of electrodes; a capacitance measuring part for measuring capacitance of respective electrode pair groups in a plurality of combinations each comprising more than one of the pairs of electrodes including a selected one of the pairs of electrodes; and an external force calculating part for calculating magnitude of external force applied to position of the selected pair of electrodes based on a plurality of measured values of the capacitance.

According to the present means, distance between at least one of the pairs of electrodes varies with elastic deformation of the dielectric layer upon application of external force and causes a variation in capacitance between the pair of electrodes. The sensor device obtains the position and magnitude of external force by using this relation. In addition, the capacitance measuring part of the present means measures not capacitance of each pair of electrodes but capacitance of each electrode pair group constituted by a plurality of pairs of electrodes. Therefore, it is not area of one pair of electrodes but area of a plurality of pairs of electrodes that is measured. Here, capacitance has a greater value as the area of one or more pairs of electrodes is larger. Therefore, a greater value of capacitance can be output by measuring capacitance of one electrode pair group when compared to a value obtained by measuring capacitance of one pair of electrodes. Accordingly, capacitance can be measured with high accuracy.

However, simple measurement of capacitance of an electrode pair group constituted by a plurality of pairs of electrodes corresponds to conventional measurement in which area of one pair of electrodes is expanded. That is to say, such simple measurement as it is cannot detect the position of external force applied within one electrode pair group. However, the present means allows detection of the position of external force applied within one electrode pair group as mentioned below.

According to the present means, the capacitance measuring part measures capacitance of respective electrode pair groups in a plurality of combinations each including a selected one of the pairs of electrodes. That is to say, the selected pair of electrodes is included in electrode pair groups in a plurality of combinations. Accordingly, all values of capacitance of these electrode pair groups are affected by the capacitance of the selected pair of electrodes.

Then the external force calculating part calculates the magnitude of external force applied to the position of the selected pair of electrodes based on capacitance of the electrode pair groups in a plurality of combinations. Here, capacitance of the selected pair of electrodes is proportional to the magnitude of external force applied to the selected pair of electrodes. Therefore, the external force calculating part calculates external force as a value proportional to capacitance of the selected pair of electrodes by using capacitance of the plurality of electrode pair groups. For example, in consideration of the degree of effect of capacitance of the selected pair of electrodes on each of the electrode pair groups, the external force calculating part determines the degree of effect of capacitance of each of the electrode pair groups and calculates the magnitude of external force applied to the selected pair of electrodes. Therefore, the present sensor device can detect external force received by each of the pairs of electrodes constituting the electrode pair groups. That is to say, the present sensor device can obtain the magnitude and position of external force applied to the matrix capacitive sensor with high precision and high resolution capability.

Moreover, the capacitive sensor can comprise a first electrode group comprising a plurality of first electrodes extending in one direction and arranged in a second direction perpendicular to the first direction; a second electrode group comprising a plurality of second electrodes extending in the second direction and arranged in the first direction, and arranged to face the first electrode group with a distance therebetween; and the dielectric layer disposed between the first electrode group and the second electrode group. Owing to this construction, the number of electrodes and wires can be reduced.

Moreover, each of the electrode pair groups whose capacitance is to be measured by the capacitance measuring part can comprise a plurality of adjoining ones of the pairs of electrodes. This allows relatively easy determination of the degree of effect of the selected pair of electrodes on each of the electrode pair groups. That is to say, the magnitude and position of external force can be obtained with high accuracy by simple calculation.

Furthermore, each of the electrode pair groups whose capacitance is to be measured by the capacitance measuring part can be one of the electrode pair groups not including a just measured one of the electrode pair groups. Here, an electrode pair group is charged with electricity by measurement of capacitance. If an electrode pair group just measured overlaps an electrode pair group to be measured next, capacitance of the electrode pair group to be next is likely to be affected by an electric charge of the electrode pair group caused by the last measurement. In contrast, according to the above construction, an electrode pair group just measured and an electrode pair group to be measured next do not overlap. Therefore, capacitance of the electrode pair group to be measured next can be little affected by the electric charge of the electrode pair group caused by the last measurement. As a result, capacitance of the electrode pair group to be measured next can be measured with high accuracy. Accordingly, the position and magnitude of external force applied to the capacitive sensor can be calculated with high accuracy.

DESCRIPTION OF THE PREFERRED EMBODIMENTS

Example 1

Figure 1:
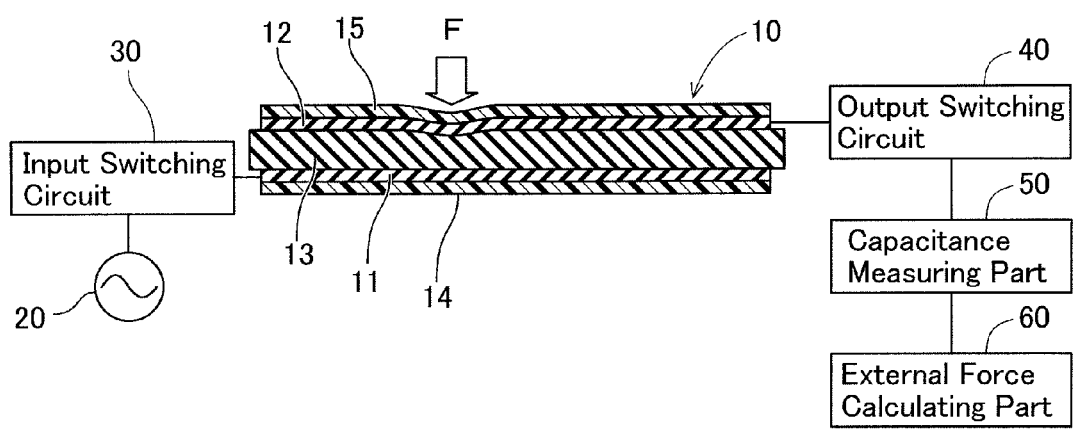
FIG. 1 is a view showing construction of a capacitive sensor device of Example 1 and includes a cross sectional view of a capacitive sensor.

A capacitive sensor device of Example 1 will be described with reference to FIGS. 1 and 2. The capacitive sensor device can detect distribution of external force, that is, position and magnitude of external force applied to a surface of a sheet-shaped capacitive sensor. The capacitive sensor device will be described in detail hereinafter.

The capacitive sensor device comprises a capacitive sensor 10, an AC source 20, an input switching circuit 30, an output switching circuit 40, a capacitance measuring part 50, and an external force calculating part 60. The capacitive sensor 10 is formed in a sheet shape, and is flexible and stretchable. Therefore, the capacitive sensor 10 can have not only a flat plane shape but also a curved plane shape. However, the capacitive sensor 10 having a flat plane shape will hereinafter be described with reference to FIG. 1.

The capacitive sensor 10 comprises pairs of electrodes Es (constituted by first electrodes 11a to 11i and second electrodes 12a to 12i) arranged in a matrix, each of the pairs of electrodes being disposed to face each other with a distance therebetween in a direction normal to the plane (a vertical direction in FIG. 1), and an elastically deformable dielectric layer 13 arranged between each of the pairs of electrodes Es. FIG. 2 shows the capacitive sensor 10 in which the pairs of electrodes Es are arranged in a matrix with 9 rows in a lateral direction (hereinafter referred to as an "X direction" and 9 columns in a longitudinal direction (hereinafter referred to as a "Y direction"). In FIG. 2, a portion surrounded by a circle A indicates one of the pairs of electrodes Es.

However, if the pairs of electrodes Es are dotted in a matrix in the capacitive sensor 10, the number of electrodes and wires increases, so the capacitive sensor 10 has the following construction. That is to say, the capacitive sensor 10 is constructed to comprise a first electrode group 11, a second electrode group 12, the dielectric layer 13 disposed between the first electrode group 11 and the second electrode group 12, and insulating layers 14, 15 disposed so as to cover a front surface on a side of the second electrode group 12 and a rear surface on a side of the first electrode group 11.

The first electrode group 11 comprises the plurality of elongated first electrodes 11a to 11i extending in the X direction and arranged in a plurality of (e.g. nine) parallel lines in the Y direction (a perpendicular direction to the X-axis direction). The second electrode group 12 comprises the plurality of elongated second electrodes 12a to 12i extending in the Y direction and arranged in a plurality of (e.g., nine) parallel lines in the X direction and arranged to face the first electrode group 11 with a distance therebetween in a direction normal to the plane. Here, the second electrode group 12 is disposed on a more front surface side of the capacitive sensor 10 than the first electrode group 11. Here, each intersecting portion of the first electrode group 11 and the second electrode group 12 constitutes a pair of electrodes Es.

Moreover, the distance between at least one of the first electrodes 11a to 11i and at least one of the second electrodes 12a to 12i varies with external force F applied to a front surface of the capacitive sensor 10, and capacitance between that of the first electrodes 11a to 11i and that of the second electrodes 12a to 12i varies with this variation in the distance. Since it is well known that capacitance is inversely proportional to the distance between the pair of electrodes, detailed description will be omitted.

The first electrodes 11a to 11i and the second electrodes 12a to 12i are formed of the same material. Specifically, the material of the first electrodes 11a to 11i and the second electrodes 12a to 12i is formed by mixing a conductive filler in elastomer. The first electrodes 11a to 11i and the second electrodes 12a to 12i are designed to be flexible and stretchable.

Examples of the elastomer constituting the first electrodes 11a to 11i and the second electrodes 12a to 12i include silicon rubber, ethylene-propylene copolymer rubber, natural rubber, styrene-butadiene copolymer rubber, acrylonitrile-butadiene copolymer rubber, acrylic rubber, epichlorohydrin rubber, chlorosulfonated polyethylene, polyethylene chloride, and urethane rubber. The conductive filler mixed in the first electrodes 11a to 11i and the second electrodes 12a to 12i only needs to be conductive particles, and can be, for example, fine particles of carbon materials and metals.

The dielectric layer 13 is formed of elastomer or resin and is flexible and stretchable just like the first electrodes 11a to 11i and the second electrodes 12a to 12i. Examples of elastomer constituting this dielectric layer 13 include silicon rubber, acrylonitrile-butadiene copolymer rubber, acrylic rubber, epichlorohydrin rubber, chlorosulfonated polyethylene, polyethylene chloride, and urethane rubber. Examples of resin constituting the dielectric layer 13 include polyethylene, polypropylene, polyurethane, polystyrene (including cross-linked foamed polystyrene), polyvinyl chloride-polyvinylidene chloride copolymer, and ethylene-acetic acid copolymer.

This dielectric layer 13 has a predetermined thickness and almost the same size as or a larger size than outer size of the first electrodes 11 and the second electrodes 12. The insulating layers 14, are flexible and stretchable just like the first electrodes 11a to 11i and the second electrodes 12a to 12i. Elastomer or resin constituting these insulating layers 14, 15 can be, for example, materials mentioned as the elastomer or resin constituting the dielectric layer 13.

When the capacitive sensor 10 receives external force F to compress the capacitive sensor 10 in a direction normal to the plane of the capacitive sensor 10, the dielectric layer 13 undergoes compressive deformation in the direction normal to the plane, so the distance decreases between at least one of the first electrodes 11a to 11i and at least one of the second electrodes 12a to 12i which are located in a portion to which the external force F is applied. In this case, capacitance increases between the one of the first electrodes 11a to 11i and the one of the second electrodes 12a to 12i of that portion.

The AC source 20 generates an AC voltage and applies the voltage to the first electrode group 11 of the capacitive sensor 10.

The input switching circuit 30 is constituted by a plurality of switches 30a to 30i. One end of each of the switches 30a to 30i is connected to the AC source 20 and the other end of each of the switches 30a to 30i is connected to a corresponding one of the first electrodes 11a to 11i. The input switching circuit 30 connects a plurality of electrodes selected from the first electrodes 11a to 11i to the AC source 20, while disconnecting others of the first electrodes 11a to 11i from the AC source 20. In FIG. 2, a first switch 30a and a second switch 30b of the input switching circuit 30 are shorted (are turned on) and other switches 30c to 30i are disconnected (are turned off).

The output switching circuit 40 is constituted by a plurality of switches 40a to 40i. One end of each of the switches 40a to 40i is connected to a corresponding one of the second electrodes 12a to 12i and the other end of each of the switches 40a to 40i is connected to the capacitance measuring part 50. The output switching circuit 40 connects a plurality of electrodes selected from the second electrodes 12a to 12i to the capacitance measuring part 50, while disconnecting others of the second electrodes 12a to 12i from the capacitance measuring part 50. In FIG. 2, the first switch 40a and the second switch 40b of the output switching circuit 40 are shorted (are turned on) and other switches 40c to 40i are disconnected (are turned off).

The capacitance measuring part 50 measures capacitance between more than one of the first electrodes 11a to 11i of the first electrode group 11 to which the AC voltage is applied and more than one of the second electrodes 12a to 12i of the second electrode group 12 which are connected by the output switching circuit 40. In practice, however, the capacitance measuring part 50 measures voltage corresponding to the capacitance. Here, FIG. 2 shows that the capacitance measuring part 50 measures voltage corresponding to capacitance between the first electrodes 11a, 11b and the second electrodes 12a, 12b.

Now, procedure for measuring capacitance by the capacitance measuring part 50 will be described with reference to FIGS. 3A to 3D. Here, in FIGS. 3A to 3D, each pair of electrodes Es is shown as a broken line square. That is to say, each pair of electrodes Es corresponds to each intersecting portion of the first electrodes 11a to 11i and the second electrodes 12a to 12i shown in FIG. 2.

Figure 3A:
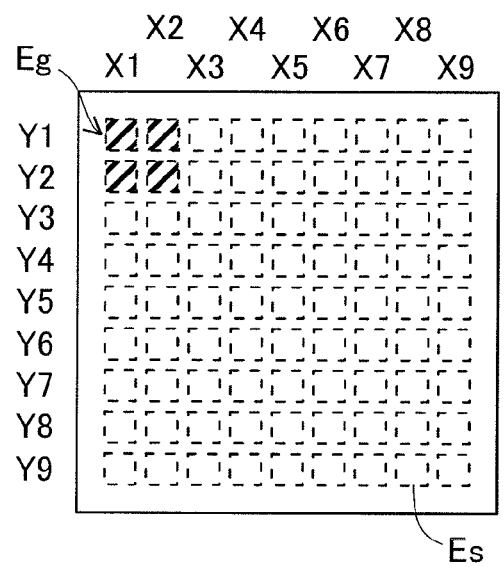
FIG. 3A is a plan view of the capacitive sensor of Example 1 in which a hatched portion indicates an electrode pair group of the capacitive sensor to be measured by a capacitance measuring part.
Figure 3B:
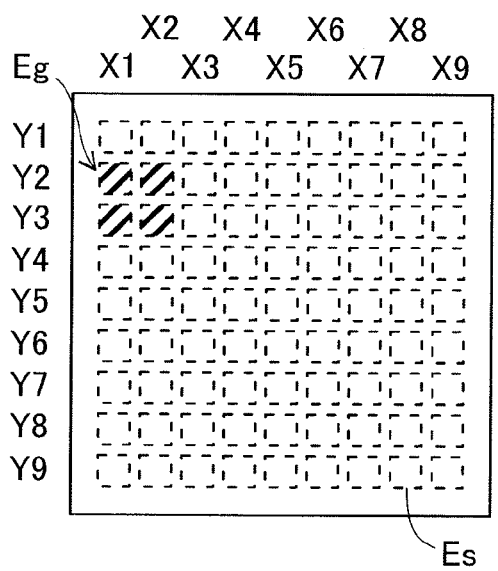
FIG. 3B is a plan view of the capacitive sensor in which a hatched portion indicates an electrode pair group of the capacitive sensor to be measured by the capacitance measuring part in a next operation in measurement order to the operation shown in FIG. 3A.

First of all, the capacitance measuring part 50 measures capacitance of an electrode pair group Eg (X1 to X2, Y1 to Y2) in a hatched area in FIG. 3A. In this case, the first switch 30a and the second switch 30b of the input switching circuit 30 are turned on and the other switches 30c to 30i remain off. On the other hand, the first switch 40a and the second switch 40b of the output switching circuit 40 are turned on and the other switches 40c to 40i remain off. Next, the capacitance measuring part 50 measures capacitance of an electrode pair group Eg (X1 to X2, Y2 to Y3) in a hatched area in FIG. 3B. In this case, the second switch 30b and the third switch 30c of the input switching circuit 30 are turned on and the other switches 30a, 30d to 30i remain off. On the other hand, the first switch 40a and the second switch 40b of the output switching circuit 40 are turned on and the other switches 40c to 40i remain off.

Figure 3C:
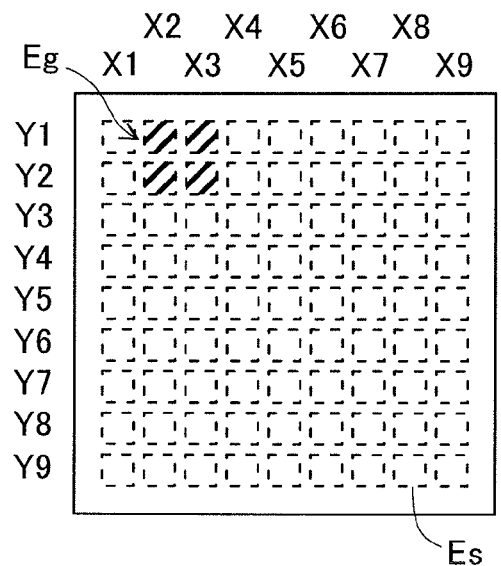
FIG. 3C is a plan view of the capacitive sensor in which a hatched portion indicates an electrode pair group of the capacitive sensor to be measured by the capacitance measuring part in a next operation in measurement order to the operation shown in FIG. 3B.
Figure 3D:
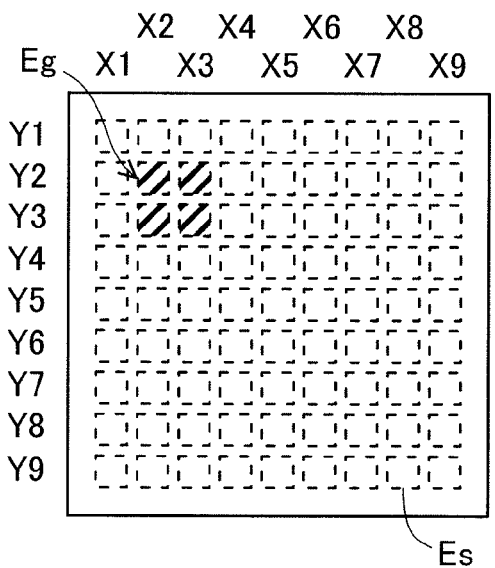
FIG. 3D is a plan view of the capacitive sensor in which a hatched portion indicates an electrode pair group of the capacitive sensor to be measured by the capacitance measuring part in a next operation in measurement order to the operation shown in FIG. 3C.
Figure 4A:
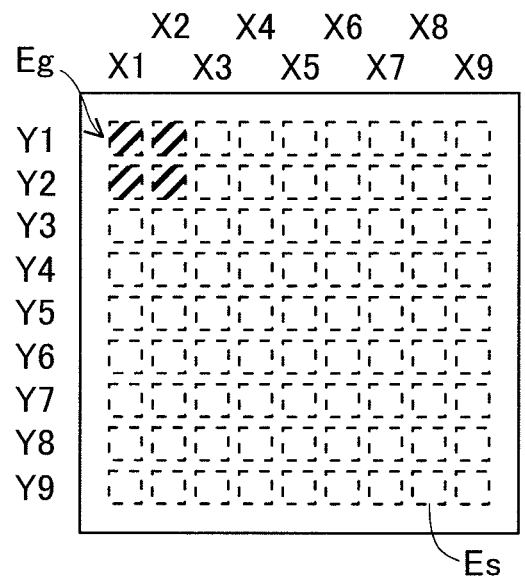
FIG. 4A is a plan view of a capacitive sensor of Example 2 in which a hatched portion indicates an electrode pair group of the capacitive sensor to be measured by a capacitance measuring part.
Figure 4B:
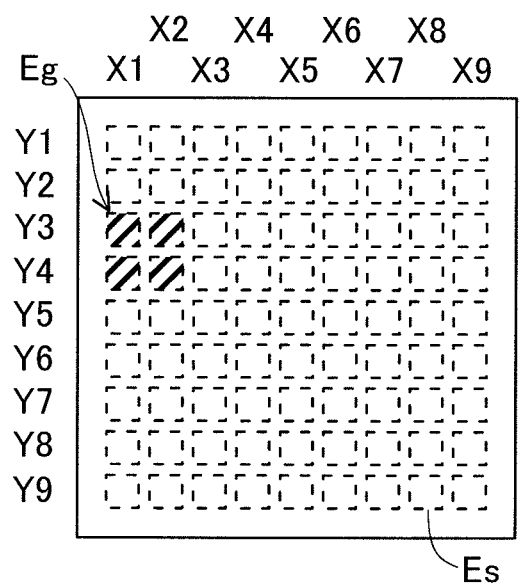
FIG. 4B is a plan view of the capacitive sensor in which a hatched portion indicates an electrode pair group of the capacitive sensor to be measured by the capacitance measuring part in a next operation in measurement order to the operation shown in FIG. 4A.
Figure 4C:
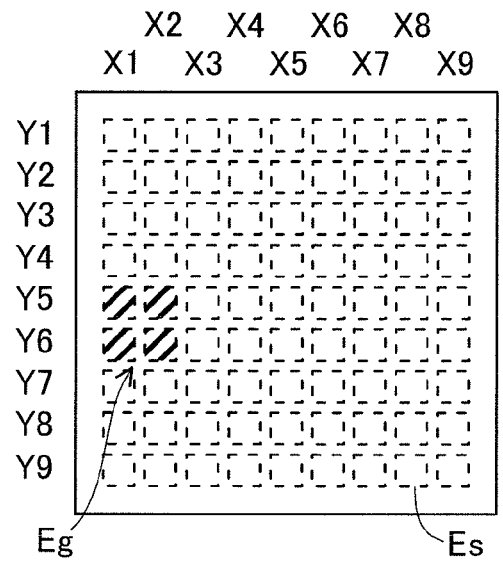
FIG. 4C is a plan view of the capacitive sensor in which a hatched portion indicates an electrode pair group of the capacitive sensor to be measured by the capacitance measuring part in a next operation in measurement order to the operation shown in FIG. 4B.
Figure 4D:
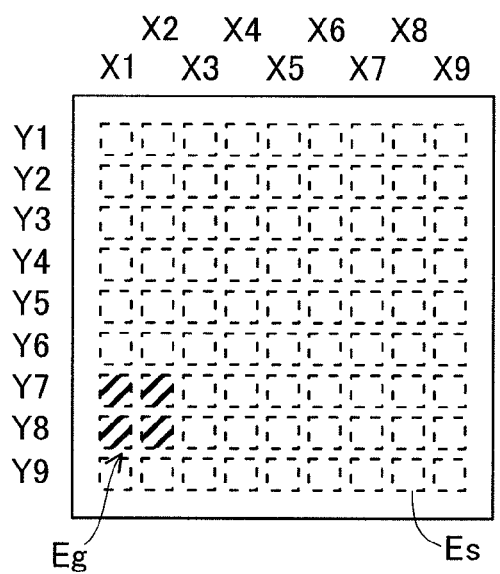
FIG. 4D is a plan view of the capacitive sensor in which a hatched portion indicates an electrode pair group of the capacitive sensor to be measured by the capacitance measuring part in a next operation in measurement order to the operation shown in FIG. 4C.
Figure 4E:
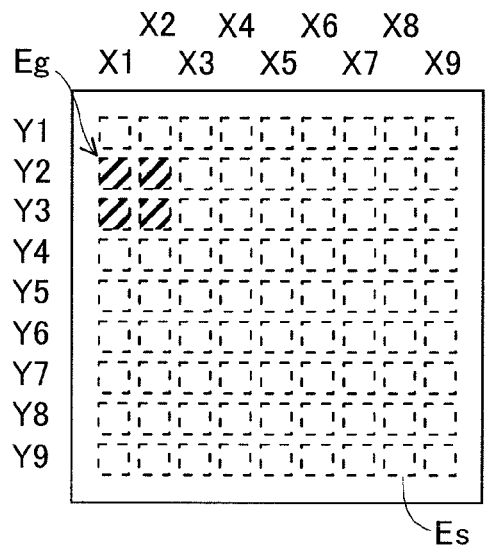
FIG. 4E is a plan view of the capacitive sensor in which a hatched portion indicates an electrode pair group of the capacitive sensor to be measured by the capacitance measuring part in a next operation in measurement order to the operation shown in FIG. 4D.
Figure 4F:
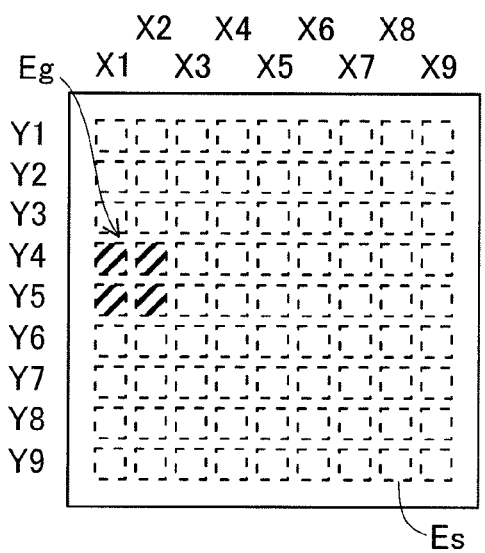
FIG. 4F is a plan view of the capacitive sensor in which a hatched portion indicates an electrode pair group of the capacitive sensor to be measured by the capacitance measuring part in a next operation in measurement order to the operation shown in FIG. 4E.

Next, the capacitance measuring part 50 measures capacitance of an electrode pair group Eg (X2 to X3, Y1 to Y2) in a hatched area in FIG. 3C. In this case, the first switch 30a and the second switch 30b of the input switching circuit 30 are turned on and the other switches 30c to 30i remain off. On the other hand, the second switch 40b and the third switch 40c of the output switching circuit 40 are turned on and the other switches 40a, 40d to 40i remain off. Next, the capacitance measuring part 50 measures capacitance of an electrode pair group Eg (X2 to X3, Y2 to Y3) in a hatched area in FIG. 3D. In this case, the second switch 30b and the third switch 30c of the input switching circuit 30 are turned on and the other switches 30a, 30d to 30i remain off. On the other hand, the second switch 40b and the third switch 40c of the output switching circuit 40 are turned on and the other switches 40a, 40d to 40i remain off.

As mentioned above, each of the electrode pair groups Eg which is measured at one time by the capacitance measuring part 50 comprises four pairs of electrodes Es which form adjoining squares. Moreover, the capacitance measuring part 50 measures capacitance of all electrode pair groups Eg which can be selected from the pairs of electrodes Es in a matrix. For example, suppose that a selected pair of electrodes Es is a pair of electrodes Es at coordinates (X2, Y2) in FIGS. 3A to 3D. In this case, as shown in FIGS. 3A to 3D, the capacitance measuring part 50 measures capacitance of four electrode pair groups Eg (X1 to X2, Y1 to Y2), (X1 to X2, Y2 to Y3), (X2 to X3, Y1 to Y2), and (X2 to X3, Y2 to Y3) including the selected pair of electrodes Es (X2, Y2).

Figure 2:
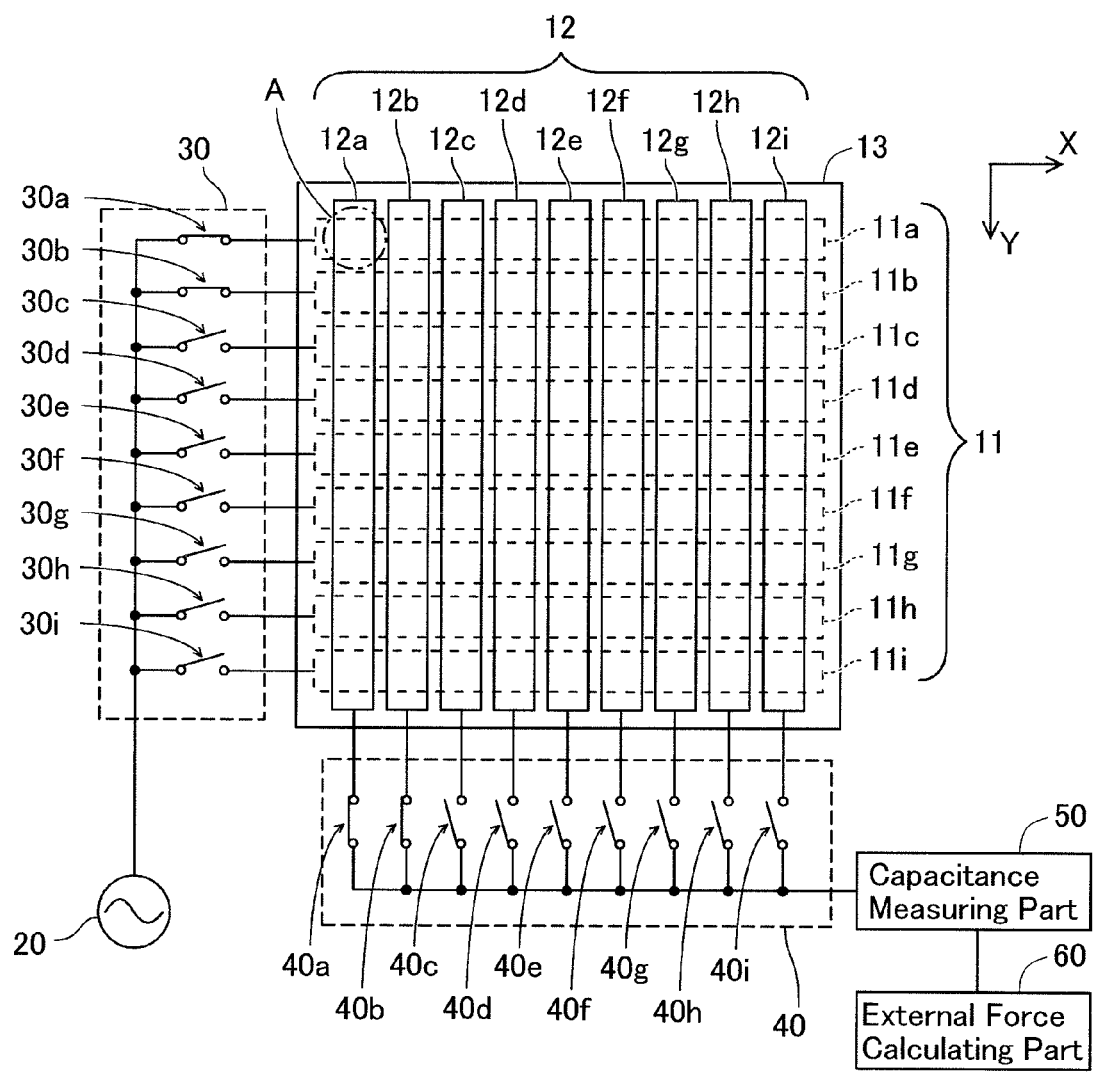
FIG. 2 is a view showing the construction of the capacitive sensor device including a view showing specific structure of the capacitive sensor, an input switching circuit, and an output switching circuit. Especially, the capacitive sensor is shown in a plan view with an insulating layer removed.

The external force calculating part 60 shown in FIGS. 1 and 2 calculates magnitude of external force applied to each pair of electrodes Es based on capacitance of a plurality of electrode pair groups Eg measured by the capacitance measuring part 50. Now, description will be given to how to calculate external force applied to the pair of electrodes Es at the coordinates (X2, Y2) in FIGS. 3A to 3D.

Suppose that capacitance of the electrode pair groups Eg (X1 to X2, Y1 to Y2), (X1 to X2, Y2 to Y3), (X2 to X3, Y1 to Y2), and (X2 to X3, Y2 to Y3) measured by the capacitance measuring part 50 are $C_{12,12}$, $C_{12,23}$, $C_{23,12}$, $C_{23,23}$, respectively. Here, each of the electrode pair groups Eg comprises four pairs of electrodes Es which form four adjoining squares. Therefore, the degree of effect of the pair of electrodes at the coordinates (X2,Y2) to be measured on each of the electrode pair groups Eg is regarded to be equal. Under these circumstances, capacitance $C_{22}$ of the pair of electrodes Es at the coordinates (X2, Y2) is measured as shown in Equation 1.

[Math. 1]

$$C_{22} = \frac{1}{4}(C_{12,12} + C_{12,23} + C_{23,12} + C_{23,23}) \quad (1)$$

$C_{22}$: capacitance of a pair of electrodes at the coordinates (X2, Y2)

$C_{12,12}$: capacitance of an electrode pair group (X1 to X2, Y1 to Y2)

$C_{12,23}$: capacitance of an electrode pair group (X1 to X2, Y2 to Y3)

$C_{23,12}$: capacitance of an electrode pair group (X2 to X3, Y1 to Y2)

$C_{23,23}$: capacitance of an electrode pair group (X2 to X3, Y2 to Y3)

The calculated capacitance $C_{22}$ of the pair of electrodes Es at the coordinates (X2, Y2) is a value proportional to the magnitude of external force applied to the pair of electrodes Es at the coordinates (X2, Y2). Therefore, the magnitude of external force applied to the pair of electrodes at the coordinates (X2, Y2) can be calculated by setting a relation between values of capacitance and the magnitude of external force beforehand.

Here, Equation 1 above shows capacitance $C_{22}$ of the pair of electrodes Es at the coordinates (X2, Y2). Capacitance $C_{km}$ of a pair of electrodes Es at other coordinates is expressed in Equation 2.

[Math. 2]

$$C_{km} = \frac{1}{4}(C_{(k-1)k,(m-1)m} + C_{(k-1)k,m(m+1)} + C_{k(k+1),(m-1)m} + C_{k(k+1),m(m+1)}) \quad (2)$$

$C_{km}$: capacitance of a pair of electrodes at the coordinates (Xk, Ym)

$C_{(k-1)k,(m-1)m}$: capacitance of an electrode pair group (X(k−1) to Xk, Y(m−1) to Ym)

$C_{(k-1)k,m(m+1)}$: capacitance of an electrode pair group (X(k−1) to Xk, Ym to Y(m+1))

$C_{k(k+1),(m-1)m}$: capacitance of an electrode pair group (Xk to X(k+1), Y(m−1) to Ym)

$C_{k(k+1),m(m+1)}$: capacitance of an electrode pair group (Xk to X(k+1), Ym to Y(m+1))

As mentioned above, distance between at least one of the pairs of electrodes Es varies with elastic deformation of the dielectric layer upon application of external force F and causes a variation in capacitance between the pair of electrodes Es. The present sensor device obtains the position and magnitude of external force F by using this relation. Moreover, the capacitance measuring part 50 measures not capacitance of each pair of electrodes Es but capacitance of each electrode pair group Eg which is constituted by a plurality of pairs of electrodes Es. Therefore, it is not area of one pair of electrodes Es but area of a plurality of pairs of electrodes Es that is measured. Here, capacitance has a greater value as the area of one or more pairs of electrodes is larger. Therefore, a greater value of capacitance can be output by measuring capacitance of one electrode pair group Eg when compared to a value obtained by measuring capacitance of one pair of electrodes Es. Therefore, capacitance can be measured with high accuracy.

However, simple measurement of capacitance of an electrode pair group Eg constituted by a plurality of pairs of electrodes Es corresponds to conventional measurement in which area of one pair of electrodes Es is expanded. That is to say, such simple measurement as it is cannot detect the position of external force F applied within the electrode pair group Eg. In contrast, the capacitance measuring part 50 measures capacitance of respective electrode pair groups Eg in a plurality of combinations each including the selected pair of electrodes Es. That is to say, the selected pair of electrodes Es is included in the electrode pair groups Eg in a plurality of combinations. Therefore, all values of capacitance of these electrode pair groups Eg are affected by the capacitance of the selected pair of electrodes Es.

Then the external force calculating part 60 calculates the magnitude of external force F applied to the position of the selected pair of electrodes Es based on capacitance of the electrode pair groups Eg in a plurality of combinations. Here, the capacitance of the selected pair of electrodes Es is proportional to the magnitude of external force F applied to the selected pair of electrodes Es. Therefore, the external force calculating part 60 calculates external force F as a value proportional to capacitance of the selected pair of electrodes Es by using capacitance of the plurality of electrode pair groups Eg. For example, in consideration of the degree of effect of capacitance of the selected pair of electrodes Es on each of the electrode pair groups Eg, the external force calculating part 60 determines the degree of effect of capacitance of each of the electrode pair groups Eg and calculates the magnitude of external force F applied to the selected pair of electrodes Es. Therefore, this sensor device can detect external force F received by each of the pairs of electrodes Es constituting the electrode pair groups Eg. That is to say, this sensor device can obtain the magnitude and position of external force F applied to the matrix capacitive sensor with high accuracy and high resolution capability.

Moreover, each of the electrode pair groups Eg whose capacitance is to be measured by the capacitance measuring part 50 comprises a plurality of adjoining pairs of electrodes Es. As mentioned before, this allows relatively easy determination of the degree of effect of the selected pair of electrodes Es on each of the electrode pair groups Eg. In the abovementioned embodiment, the degree of effect is regarded as equal. That is to say, the magnitude and position of external force F can be obtained with high accuracy by simple calculation.

Example 2

In Example 1, it has been described that measurement of the electrode pair groups Eg by the capacitance measuring part 50 is carried out in the following order: (X1 to X2, Y1 to Y2); (X1 to X2, Y2 to Y3); (X2 to X3, Y1 to Y2); and (X2 to X3, Y2 to Y3). In addition to this order, capacitance measurement can be carried out in an order shown in FIGS. 4A to 4F.

That is to say, the capacitance measuring part 50 (shown in FIGS. 1 and 2) measures capacitance of electrode pair groups Eg in the following order of the coordinates: (X1 to X2, Y1 to Y2); (X1 to X2, Y3 to Y4); (X1 to X2, Y5 to Y6); (X1 to X2, Y7 to Y8); (X1 to X2, Y2 to Y3); and (X1 to X2, Y4 to Y5). After that, the capacitance measuring part 50 measures capacitance of electrode pair groups Eg in an order of, for example, (X1 to X2, Y6 to Y7) and (X1 to X2, Y8 to Y9). Then the capacitance measuring part 50 measures capacitance of electrode pair groups at the same coordinates as those of the abovementioned coordinates except that the X coordinate is (X2 to X3).

As mentioned before, each of the electrode pair groups Eg to be measured by the capacitance measuring part 50 is an electrode pair group Eg which does not include any pair of electrodes constituting an electrode pair group just measured. Here, each electrode pair group Eg is charged with electricity by capacitance measurement. If an electrode pair group Eg just measured overlaps an electrode pair group Eg to be measured next, there is a risk that capacitance of the electrode pair group Eg to be measured next will be affected by electric charge of the electrode pair group Eg just measured. Therefore, the electrode pair group Eg just measured and the electrode pair group Eg to be measured next are designed not to overlap, as mentioned above. Therefore, capacitance of the electrode pair group Eg to be measured next can be less affected by the electric charge of the electrode pair group Eg just measured. As a result, capacitance of the electrode pair group Eg to be measured next can be measured with high accuracy. Accordingly, the position and magnitude of external force F applied to the capacitive sensor 10 can be calculated with high accuracy.

Example 3

In Examples 1 and 2, it has been described that each electrode pair group Eg is four square pairs of electrodes Es. However, each electrode pair group Eg can be nine square pairs of electrodes Es, as shown in FIG. 5, or can be constituted by any plural number of pairs of electrodes Es.

Figure 5:
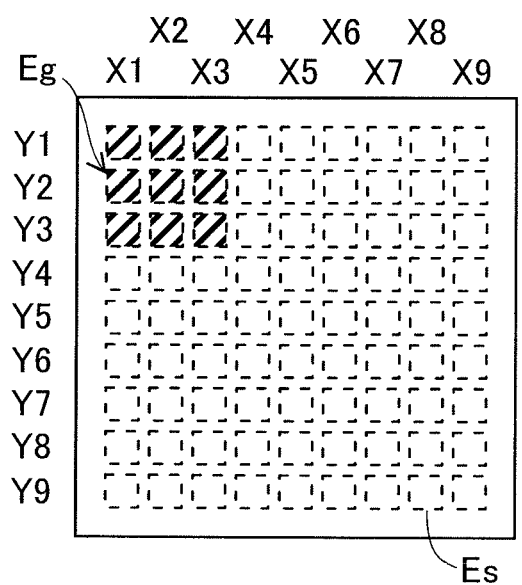
FIG. 5 is a plan view of a capacitive sensor of Example 3 in which a hatched portion indicates an electrode pair group of the capacitive sensor to be measured by a capacitance measuring part.

When each electrode pair group Eg is constituted by nine square pairs of electrodes Es as shown in FIG. 5, the external force calculating part 60 (shown in FIGS. 1 and 2) sets coefficients for respective electrode pair groups Eg as coefficients proportional to the degree of effect of a pair of electrodes whose capacitance is to be calculated. For example, capacitance of a pair of electrodes Es to be calculated is calculated using Equation 3. A first term on the right side of Equation 3 is capacitance of nine pairs of electrodes Es when their center coordinates coincide with the pair of electrode Es to be calculated. A second term on the right side of Equation 3 is capacitance of nine pairs of electrodes Es when their center coordinates are located horizontally or vertically next to the pair of electrode E to be calculated. A third term on the right side of Equation 3 is capacitance of nine pairs of electrodes Es when one corner portion of the nine pairs of electrodes Es coincides with the pair of electrodes Es to be calculated. It should be noted that coefficients a, b, and c are not limited to the following values and can be appropriately adjusted.

[Math. 3]

$$C_{km} = a \times C_{(k-1)(k+1),(m-1)(m+1)} + \\ b \times \left( \begin{array}{c} C_{(k-1)(k+1),(m-2)m} + C_{(k-1)(k+1),m(m+2)} + \\ C_{(k-2)k,(m-1)(m+1)} + C_{k(k+2),(m-1)(m+1)} \end{array} \right) + \\ c \times \left( \begin{array}{c} C_{(k-2)k,(m-2)m} + C_{(k-2)k,m(m+2)} + \\ C_{k(k+2),(m-2)m} + C_{k(k+2),m(m+2)} \end{array} \right)$$

$$a = \frac{3}{9}$$

$$b = \frac{1}{9}$$

$$c = \frac{1}{18}$$

$C_{km}$: capacitance of a pair of electrodes at the coordinates (Xk, Ym)

$C_{(k-1)(k+1),\ (m-1)(m+1)}$: capacitance of an electrode pair group at (X(k−1) to X(k+1), Y(m−1) to Y(m+1))

What is claimed is:

1. A capacitive sensor device, comprising:
   a capacitive sensor comprising pairs of electrodes that are defined by respective first electrodes of a first electrode group and respective second electrodes of a second electrode group arranged in a matrix, each of the pairs of electrodes being disposed to face each other with a distance therebetween, and an elastically deformable dielectric layer arranged between each of the pairs of electrodes;
   a capacitance measurer that measures capacitance of respective electrode pair groups in a plurality of combinations, each of the plurality of combinations of electrode pair groups comprising a same selected one of the pairs of electrodes and the pairs of electrodes adjoining the same selected one of the pairs of electrodes;
   an external force calculator that calculates a magnitude of external force applied to position of the selected pair of electrodes based on a plurality of measured values of the capacitance;
   an input switching circuit having a plurality of first switches; and
   an output switching circuit having a plurality of second switches,
   wherein the plurality of first switches are configured to connect at least two of the first electrodes to a voltage source and the plurality of second switches are configured to connect at least two of the second electrodes to the capacitance measurer such that a capacitance of at least a plurality of the pairs of electrodes can be directly measured at the same time.

2. The capacitive sensor device according to claim 1, wherein:
   the first electrodes extend in a first direction and are arranged in a second direction perpendicular to the first direction;
   the second electrodes extend in the second direction and are arranged in the first direction, and the second electrode group being arranged to face the first electrode group with a distance therebetween; and
   the dielectric layer disposed between the first electrode group and the second electrode group.

3. The capacitive sensor device according to claim 1, wherein each of the electrode pair groups whose capacitance is to be measured by the capacitance measurer comprises a plurality of adjoining ones of the pairs of electrodes.

4. The capacitive sensor device according to claim 1, wherein each of the electrode pair groups whose capacitance is to be measured by the capacitance measurer is one of the electrode pair groups not including pairs of electrodes constituting a just measured one of the electrode pair groups.

* * * * *